(12) United States Patent
Gorski et al.

(10) Patent No.: US 10,482,209 B1
(45) Date of Patent: Nov. 19, 2019

(54) FIELD PROGRAMMABLE OPERATION BLOCK ARRAY

(71) Applicant: HLS Logix LLC, Rochester, MI (US)

(72) Inventors: Jason Daniel Gorski, Waterford, MI (US); Darrin Michael Hanna, Rochester, MI (US)

(73) Assignee: HLS Logix LLC, Rochester, MI (US)

( * ) Notice: Subject to any disclaimer, the term of this patent is extended or adjusted under 35 U.S.C. 154(b) by 0 days.

(21) Appl. No.: 16/055,242

(22) Filed: Aug. 6, 2018

(51) Int. Cl.
*G06F 17/50* (2006.01)
*H03K 19/173* (2006.01)
*H03K 19/177* (2006.01)

(52) U.S. Cl.
CPC ..... *G06F 17/5054* (2013.01); *H03K 19/1737* (2013.01); *H03K 19/17708* (2013.01); *H03K 19/17728* (2013.01)

(58) Field of Classification Search
None
See application file for complete search history.

(56) References Cited

U.S. PATENT DOCUMENTS

| | | | |
|---|---|---|---|
| 5,155,389 A | 10/1992 | Furtek | |
| 5,367,209 A | 11/1994 | Hauck et al. | |
| 5,521,835 A | 5/1996 | Trimberger | |
| 5,742,179 A | 4/1998 | Sasaki | |
| 5,742,180 A | 4/1998 | Dehon et al. | |
| 5,805,477 A | 9/1998 | Perner | |
| 5,815,726 A | 9/1998 | Cliff | |
| 5,956,518 A | 9/1999 | Dehon et al. | |
| 5,970,254 A | 10/1999 | Cooke et al. | |
| 6,026,481 A | 2/2000 | New et al. | |
| 6,091,263 A | 7/2000 | New et al. | |
| 6,130,553 A | 10/2000 | Nakaya | |
| 6,150,836 A | 11/2000 | Abbott | |
| 6,191,611 B1 | 2/2001 | Altaf | |
| 6,288,570 B1 * | 9/2001 | New | G06F 7/503 326/40 |
| 6,381,732 B1 | 4/2002 | Burnham et al. | |

(Continued)

FOREIGN PATENT DOCUMENTS

| | | |
|---|---|---|
| EP | 0507507 A2 | 10/1992 |
| EP | 0956646 B1 | 4/2003 |

(Continued)

OTHER PUBLICATIONS

Myjak, Mitchell J. et al.; A Medium-Grain Reconfigurable Architecture for DSP: VLSI Design, Benchmark Mapping, and Performance; IEEE Transactions on Very Large Scale Integration (VLSI) Systems, vol. 16, No. 1, Jan. 2008, pp. 14-23.

(Continued)

*Primary Examiner* — Minh D A
*Assistant Examiner* — James H Cho
(74) *Attorney, Agent, or Firm* — PatentXP PLLC; Stephen J. Kontos

(57) ABSTRACT

A field-programmable operation array includes an interconnect network and a plurality of operation blocks, including a first operation block and a second operation block, electrically connected to the interconnect network. Each operation block includes an arithmetic logic unit and a plurality of logic gates. A pass signal output by the arithmetic logic unit of the first operation is received by the arithmetic logic unit of the second operation block.

9 Claims, 7 Drawing Sheets

(56) References Cited

U.S. PATENT DOCUMENTS

| | | | |
|---|---|---|---|
| 6,476,634 B1* | 11/2002 | Bilski | G06F 17/5054 |
| | | | 326/38 |
| 6,496,918 B1 | 12/2002 | Dehon et al. | |
| 6,633,181 B1 | 10/2003 | Rupp | |
| 6,813,754 B2 | 11/2004 | Wu et al. | |
| 6,883,084 B1 | 4/2005 | Donohoe | |
| 7,145,361 B1 | 12/2006 | Rohe et al. | |
| 7,257,803 B1 | 8/2007 | Wilton et al. | |
| 7,365,566 B2 | 4/2008 | Aoyama et al. | |
| 7,425,841 B2 | 9/2008 | Schmit et al. | |
| 7,441,105 B1 | 10/2008 | Metzgen | |
| 7,576,564 B2 | 8/2009 | Schmit et al. | |
| 7,663,400 B1* | 2/2010 | Plants | G06F 7/506 |
| | | | 326/38 |
| 7,698,449 B1 | 4/2010 | Keller et al. | |
| 8,051,277 B1 | 11/2011 | Callen | |
| 8,138,788 B2 | 3/2012 | Honda | |
| 8,587,336 B2 | 11/2013 | Sueyoshi et al. | |
| 9,378,027 B2 | 6/2016 | Kakolaki et al. | |
| 2003/0055852 A1* | 3/2003 | Wojko | G06F 7/57 |
| | | | 708/230 |
| 2005/0190597 A1 | 9/2005 | Kato | |
| 2006/0109027 A1 | 5/2006 | Veredas-Ramirez | |
| 2007/0247189 A1 | 10/2007 | Phil et al. | |
| 2008/0229081 A1* | 9/2008 | Yamanaka | G06F 15/7867 |
| | | | 712/221 |
| 2014/0195779 A1 | 7/2014 | Nicol et al. | |
| 2018/0004530 A1 | 1/2018 | Vorbach | |
| 2018/0129475 A1* | 5/2018 | Almagambetov | G06F 7/525 |

FOREIGN PATENT DOCUMENTS

| | | |
|---|---|---|
| EP | 1597825 B1 | 6/2007 |
| JP | 3722351 B2 | 11/2005 |
| JP | 3837135 B2 | 10/2006 |
| JP | 2010166255 A | 7/2010 |
| JP | 5523988 B2 | 6/2014 |

OTHER PUBLICATIONS

Marshall, Alan et al; A Reconfigurable Arithmetic Array for Multimedia Applications; FPGA '99 Proceedings of the 1999 ACM/SIGDA seventh international symposium on Field programmable gate arrays; Feb. 1, 1999, pp. 135-143; ACM New York, NY, USA © 1999.

Compton, Katherine et al; Reconfigurable Computing: A Survey of Systems and Software; ACM Computing Surveys, vol. 34, No. 2, Jun. 2002, pp. 171-210.

\* cited by examiner

FIELD PROGRAMMABLE OPERATION BLOCK ARRAY

BACKGROUND

Embedded systems generally refer to a collection of computing components that perform a specific function within a larger system. The computing components involved in an embedded system typically include a microcontroller, an application-specific integrated circuit (ASIC), or a field-programmable gate array (FPGA). A microcontroller includes a processor, memory, and pins for receiving input signals and for outputting output signals. An ASIC is an integrated circuit with a customizable array of logic gates. Like an ASIC, an FPGA also has a customizable array of logic gates except that the logic gates of an FPGA are connected through interconnects that can be customized via computer code such as hardware description language (HDL) code.

DETAILED DESCRIPTION

Embedded systems based on microcontrollers, ASICs, and FPGAs have certain tradeoffs. Microcontrollers, which are general purpose devices, often lack optimal transistor usage, performance, and power efficiency. While ASICs are highly customizable and generally perform better than microcontrollers, ASIC development can be cost-prohibitive, too time consuming, or both. While FPGAs generally perform better than microcontrollers and are generally less expensive to customize than ASICs, customizing an FPGA can still be time consuming, and the interconnects between the logic gates can introduce performance inefficiencies.

Another way to implement an embedded system involves a field-programmable operation-block array (FPOA) implementing a circuit developed through high-level synthesis (HLS) design. A field-programmable operation array includes an interconnect network and a plurality of operation blocks, including a first operation block and a second operation block, electrically connected to the interconnect network. Each operation block includes an arithmetic logic unit and a plurality of logic gates. A pass signal output by the arithmetic logic unit of the first operation is received by the arithmetic logic unit of the second operation block. The pass signal allows one operation block to form a chain with other operation blocks. Chaining multiple operation blocks together allows the group of operation blocks to perform operations on larger data sets than a single operation block could perform. For example, chaining multiple operation blocks together allows the FPOA to implement an HLS operation. In other words, as described in greater detail below, a circuit developed using HLS tools can be mapped directly to the operation blocks of the FPOA.

The elements shown may take many different forms and include multiple and/or alternate components and facilities. The example components illustrated are not intended to be limiting. For instance, the FPOA shown and described below can be modified to support different HLS operations, code structures, etc. Indeed, additional or alternative components and/or implementations may be used. Further, the elements shown are not necessarily drawn to scale unless explicitly stated as such.

Figure 1:
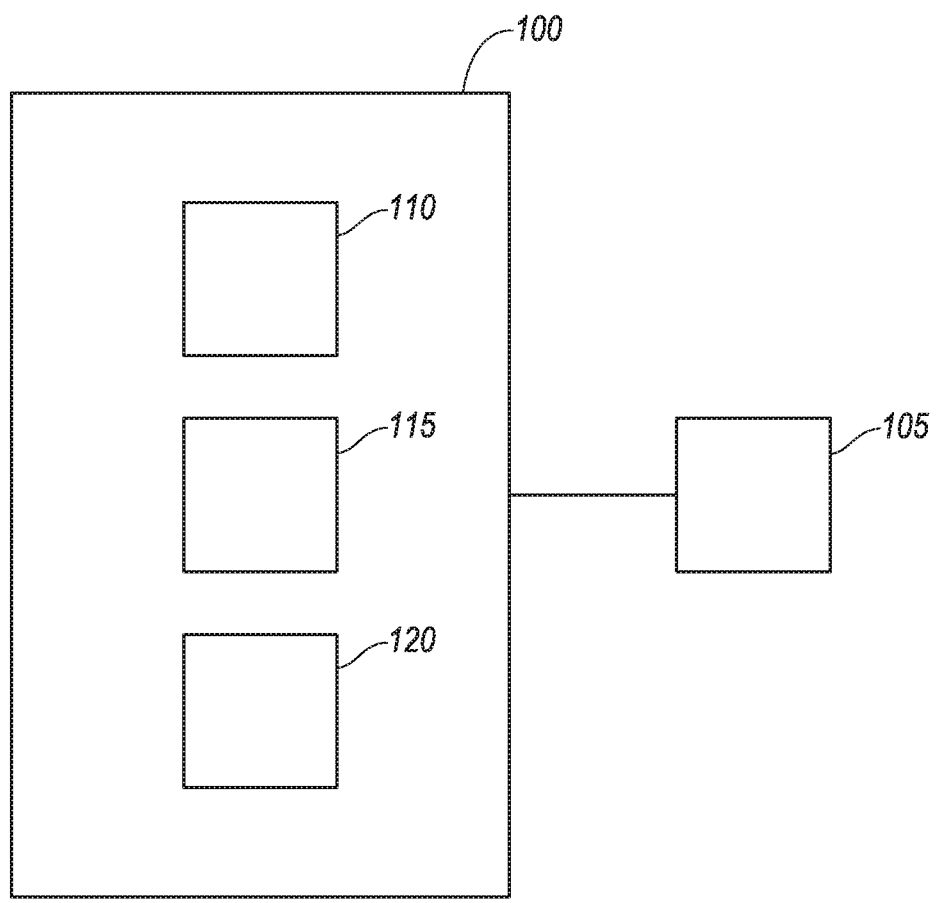
FIG. 1 illustrates an example computer in communication with a field programmable operation array.

Referring now to FIG. 1, a computer 100 is connected to a field-programmable operation-block array (FPOA) 105. The computer 100 runs software such as a programming tool 110, a high level synthesis (HLS) tool 115, and an FPOA tool 120 that can be used to configure the FPOA to operate as a particular circuit. The computer 100 is implemented via circuits, chips, and other electronic components. For example, the computer 100 includes a memory and a processor programmed to execute instructions stored in the memory. The instructions executed by the processor may include instructions associated with the programming tool 110, the HLS tool 115, the FPOA tool 120, or both.

The programming tool 110 is implemented via software running on the computer 100. When running the programming tool 110, the computer 100 accepts user inputs in the form of a programming language such as C, C++, Java, or the like. The code may define a particular circuit to be implemented via the FPOA 105. The programming tool 110 may include a debugger programmed to, e.g., confirm that the circuit defined by the code meets certain functional specifications.

The HLS tool 115 is implemented via software running on the computer 100. During execution by the computer 100, the HLS tool 115 receives the code output by the programming tool 110. Further, when running the HLS tool 115, the computer 100 converts the output of the programming tool 110 into a digital circuit with a scheduled series of hardware operations. The HLS tool 115 may include a compiler to compile the output of the programming tool 110. Further, when executing the HLS tool 115, the computer 100 may generate a netlist file containing a list of operations and their associated interconnections. The HLS tool 115 may cause the computer 100 to generate the netlist file according to the code output by the programming tool 110.

The FPOA tool 120 is implemented via software running on the computer 100. During execution of the FPOA tool 120 by the computer 100, the FPOA tool 120 receives the netlist file output by the HLS tool 115, determines the operation block (see FIG. 2) placement, and generates a programming file specifying the operation blocks and interconnects that will carry out the circuit represented by the code entered by the user via the programming tool 110. When executing the FPOA tool 120, the computer 100 may output signals to the FPOA 105 to configure the FPOA 105 according to the programming file.

Figure 2:
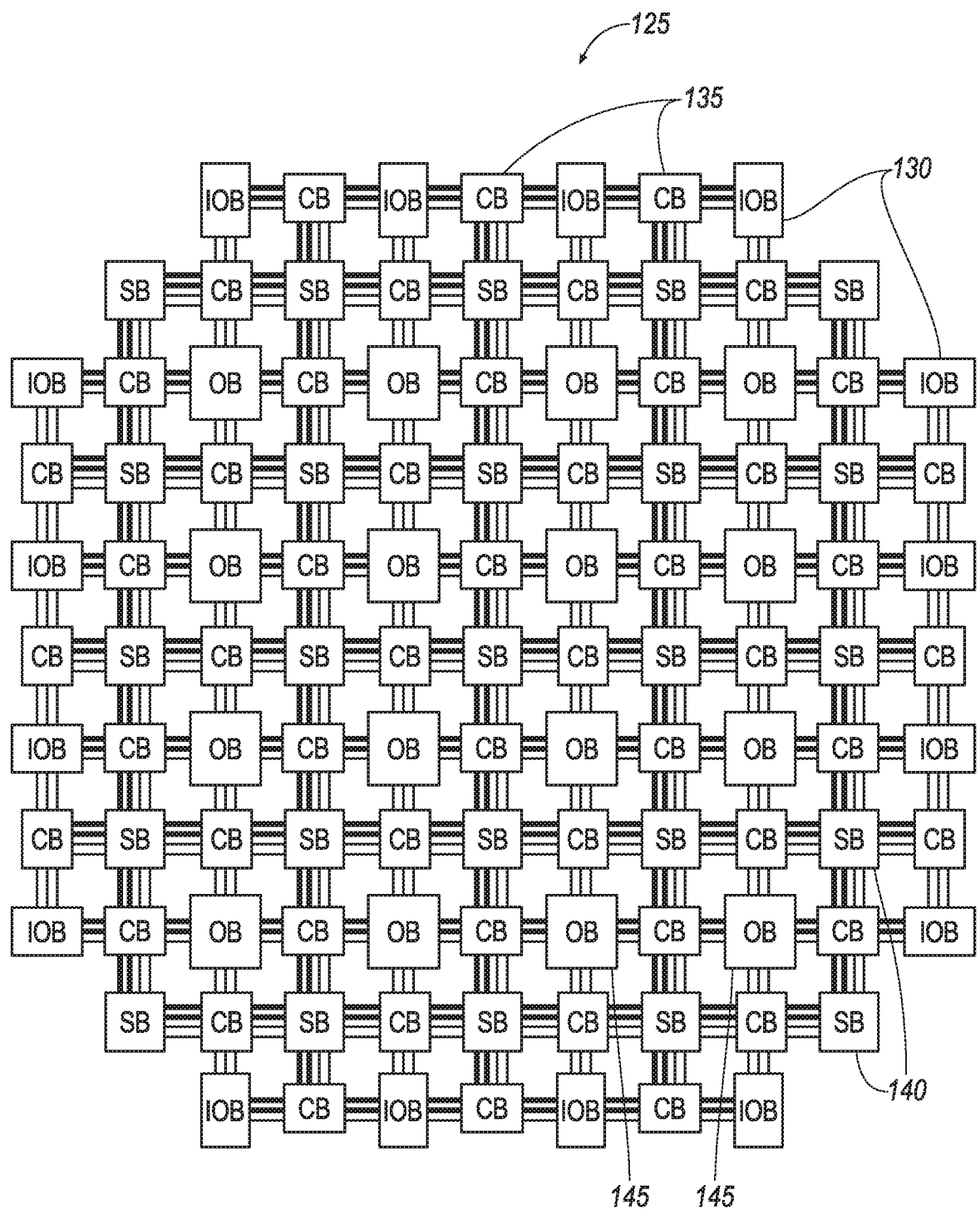
FIG. 2 illustrates example components of an example field programmable operation array.

FIG. 2 illustrates an example architecture 125 of the FPOA 105. As shown, the FPOA 105 includes an interconnect network including input/output (IO) blocks 130, connection blocks 135, and switch blocks 140. The architecture 125 of the FPOA 105 further includes operation blocks 145. The heavier lines connecting the blocks in FIG. 2 may represent multi-bit (e.g., 4-bit, 8-bit, 12-bit, etc.) communication channels and the lighter lines connecting the blocks in FIG. 2 may represent single-bit communication channels. The single-bit communication channels may be used to route single-bit pass and enable signals, for example. As shown, multi-bit and single-bit communications are passed separately between the operation blocks 145 of the FPOA 105.

The IO blocks 130 are implemented via electronic components that allow the FPOA 105 to interface with the computer 100 and possibly other electronic devices. The IO blocks 130 allow the FPOA 105 to receive signals from external electronic devices (which could include the computer 100) and output signals to the same or different external electronic devices.

The connection blocks 135 are implemented via electronic components that allow the IO blocks 130, switch blocks 140, and operation blocks 145 to interface with one another. Put another way, the connection blocks 135 are used to connect the input and output signals of the operation blocks 145 to routing channels. Connection blocks 135 may be connected to IO blocks 130 via multiple multi-bit channels as well as one or more single-bit channels. Connection blocks 135 may be connected to switch blocks 140 via multiple (e.g., two) multi-bit channels and multiple (e.g., two) single-bit channels. Connection blocks 135 may be connected to the operation blocks 145 via multiple (e.g., two) multi-bit channels and one or more single-bit channels, although some of the connection blocks 135 may connect to the operation blocks 145 via three single-bit channels. Whether a particular connection block 135 connects two other components of the FPOA 105 may be a function of the code provided to the computer 100. That is, the connection block 135 may connect components in the FPOA 105 in a way that carries out the circuit described by the code entered via the programming tool 110, the netlist output by the HLS tool 115, and the programming file output by the FPOA tool 120.

The switch blocks 140 are implemented via electronic components that specify routing channels between other components of the FPOA 105. For instance, the switch blocks 140 may be located at the intersection of each routing channel, and the switch blocks 140 may manage the routing of signals through the routing channels connected to the switch block 140. Each routing channel is implemented via wires, traces, etc., that carry various signals discussed below (e.g., multi-bit signals, enable signals, done signals, etc.) between the blocks of the FPOA 105. Pass signals, discussed below, may be communicated outside of the routing channels.

The operation blocks 145 are implemented via electronic components that that can be used to perform multi-bit operations such as, e.g., 4-bit by 4-bit operations, 8-bit by 8-bit operations, 12-bit by 12-bit operations, etc. Multiple operation blocks 145 may be chained together, via the connection blocks 135 and through their pass signals to perform larger bit operations. An example operation block 145, including the example components that make up an operation block 145, are shown and discussed in greater detail below with respect to FIG. 3. Further, while connection blocks 135 are shown between each operation block 145, not all signals output and received by the operation blocks 145 needs to go through a connection block 135. For instance, pass signals may be communicated between operation blocks 145 without the pass signal being transmitted through a connection block 135.

Figure 3:
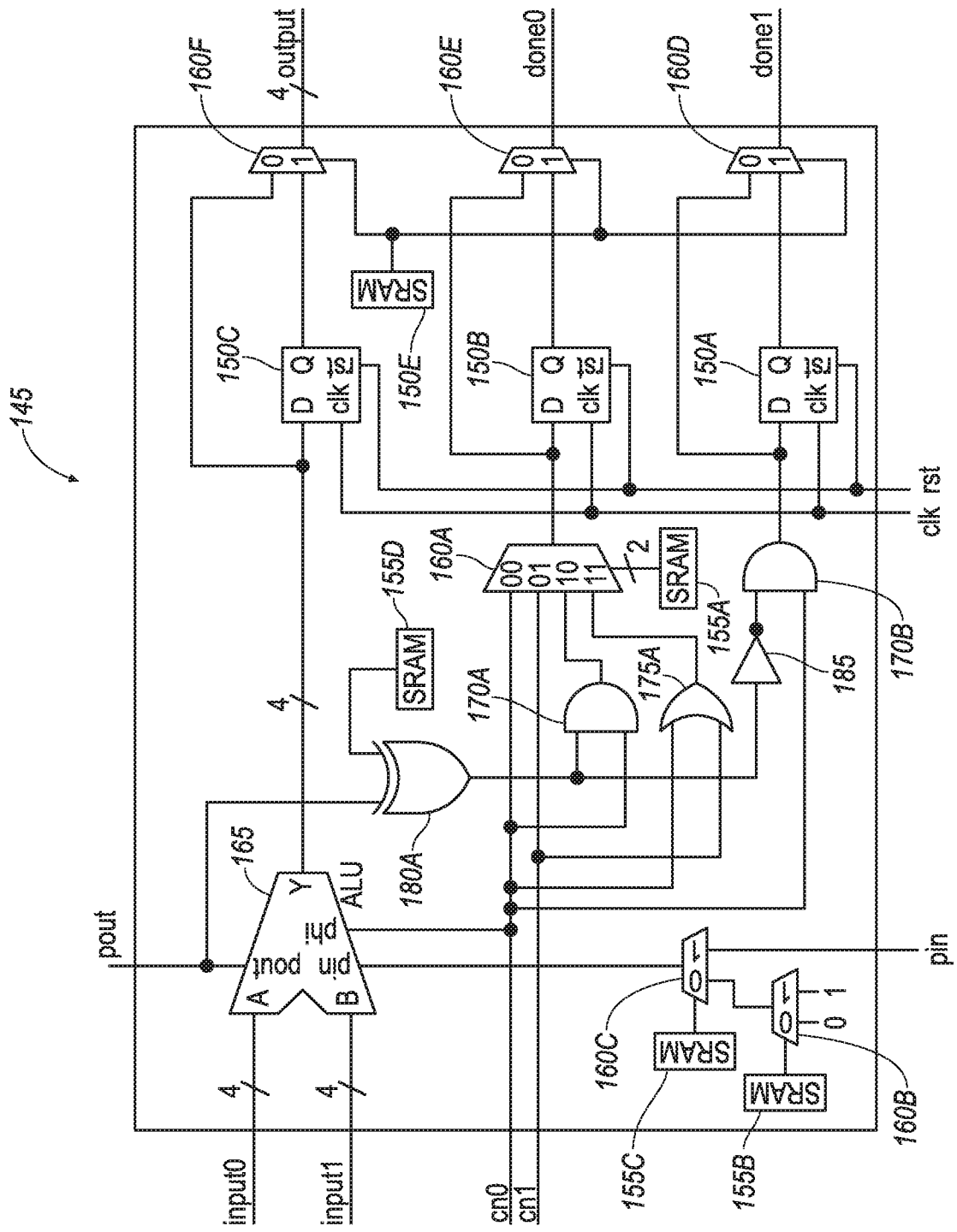
FIG. 3 illustrates example components of an operation block used in the field programmable operation array.

Referring now to FIG. 3, each operation block 145 includes logic gates, flip-flops 150, memory 155, multiplexers 160, and an arithmetic logic unit (ALU) 165.

The logic gates are implemented via electronic components that implements a Boolean operation on signals received at the logic gate. The operation block 145 shown in FIG. 3 includes logic gates such as two AND gates 170 (an AND gate 170A and an AND gate 170B), an OR gate 175A, an exclusive OR gate (XOR gate) 180A, and a NOT gate 185. The AND gate 170A receives one of the enable signals passed to the operation block 145 from one of the connection blocks 135. The AND gate 170A also receives the output of the XOR gate 180A. The output of the AND gate 170A is passed to a multiplexer 160A. The AND gate 170B receives the output of the NOT gate 185 and the same enable signal as the AND gate 170A. The output of the AND gate 170B is passed to a flip-flop 150A. The OR gate 175A receives the enable signals from one of the connection blocks 135, but not necessarily the same connection block 135 that provides the enable signals. The output of the OR gate 175A is connected to the multiplexer 160A. The XOR gate 180A receives the one of the pass signals, e.g., the output pass signal from the ALU 165, as well as a signal from a memory 155A. The output of the XOR gate 180A is connected to the AND gate 170 and the NOT gate 185. The NOT gate 185 inverts the output of the XOR gate 180A, and the output of the NOT gate 185 is connected to the AND gate 170B.

The flip-flops 150 are implemented via electronic components that output a signal representing the state of the flip-flop 150. The state of the flip-flop 150 is based on the input to the flip-flop 150. The state changes in accordance with a clock signal (CLK) provided to the flip-flop 150, a reset signal (RST) provided to the flip-flop 150, or both. The flip-flop 150A is connected to the output of the AND gate 170B. The output of the flip-flop 150A (i.e., the first done signal ("done0")) is one of the single-bit signals transmitted from the operation block 145 to one of the communication blocks. A flip-flop 150B is connected to the output of the multiplexer 160A, the CLK signal, and the RST signal. The flip-flop 150B outputs a second done signal ("done1") to one of the communication blocks, which could be the same communication block that receives the first done signal. A flip-flop 150C receives the multi-bit output of the ALU 165 in addition to the CLK signal and the RST signal. The flip-flop 150C outputs the multi-bit signal to the multi-bit channel connecting the operation block 145 to one of the connection blocks 135, which could be the same connection block 135 that receives the first done signal, the second done signal, or both.

Each memory 155 is implemented via circuits, chips or other electronic components and can include, e.g., static random-access memory (SRAM). Programming of the FPOA 105 may be carried out by writing a configuration byte (discussed below) to the memory 155 embedded within each operation block 145. A memory 155A is connected to a multiplexer 160A. For example, as shown in FIG. 3, the memory 155A outputs signals to the select lines of the multiplexer 160A. A memory 155B is connected to a multiplexer 160B and outputs a signal to the select line of the multiplexer 160B. A memory 155C is connected to a multiplexer 160C and outputs a signal to the select line of the multiplexer 160C. A memory 155D is connected to the input of the XOR gate 180A. Thus, the memory 155D outputs a signal to the input of the XOR gate 180A. A memory 155E outputs a signal to the multiplexers 160 D-F based on, e.g., whether the flip-flops 150A-D, respectively, receive the registered or unregistered results of the ALU 165 and the enable/done logic. Further, although shown as separate, the memory 155A, the memory 155B, the memory 155C, the memory 155D, and the memory 155E may be part of the same memory cell.

Although not shown, other components of the FPOA 105 may also include memory 155 that stores configuration bytes for the component. For example, the memory 155 associated with each connection block 135 may store a configuration byte that specifies the routing channels of each input and output of the operation blocks 145 connected to the connection block 135. Similarly, the memory 155 associated with each switch block 140 may store a configuration byte that specifies the connections between the different routing channels that enter the switch block 140.

The multiplexers 160 are implemented via electronic components that receive multiple inputs and output one of the inputs. The multiplexer 160A is connected to the first enable signal, the second enable signal, the output of the AND gate 170A, and the output of the OR gate 175A. The multiplexer 160A outputs one of those signals in accordance with the output of the memory 155A. The multiplexer 160B outputs either a one or a zero to the multiplexer 160C based on the output of the memory 155B. The multiplexer 160C receives a pass signal from one of the connection blocks 135, which may be the same connection block 135 that provides the CLK signal and the RST signal. The multiplexer 160C outputs the pass signal based on the output of the memory 155C. The multiplexers 160D-F receive the outputs of the flip-flops 150A-D, respectively, and can be used to allow output signals to either take the registered or unregistered results of the ALU logic and the enable/done logic. The multiplexer 160D receives the output of the flip-flop 150A and the output of the AND gate 170B. The multiplexer 160E receives the output of the flip-flop 150B and the output of the multiplexer 160A. The multiplexer 160F receives the output of the flip-flop 150C and the multi-bit output of the ALU 165. The output of the multiplexers 160D-F is based on the output of the memory 155E.

The ALU 165 is implemented via electronic components forming a circuit that can perform arithmetic or bitwise operations. The ALU 165 receives multi-bit operands from a connection block 135, which may be the same connection block 135 that provides the enable signals. The ALU 165 further receives the pass signal from the multiplexer 160C and outputs the pass signal to a connection block 135, which may be the same or a different connection block 135 as the one that provides the multi-bit operands, the enable signals, the CLK signal, the RST signal, etc. The pass signal may also or alternatively be output to the same or a different connection block 135 as the connection block 135 that receives the multi-bit output of the flip-flop 150C, the first done signal, the second done signal, etc. The opcode input of the ALU 165 may be connected to the first enable signal, which as discussed above is also connected to the AND gate 170A, the AND gate 170B, and the OR gate 175A.

Figure 4:
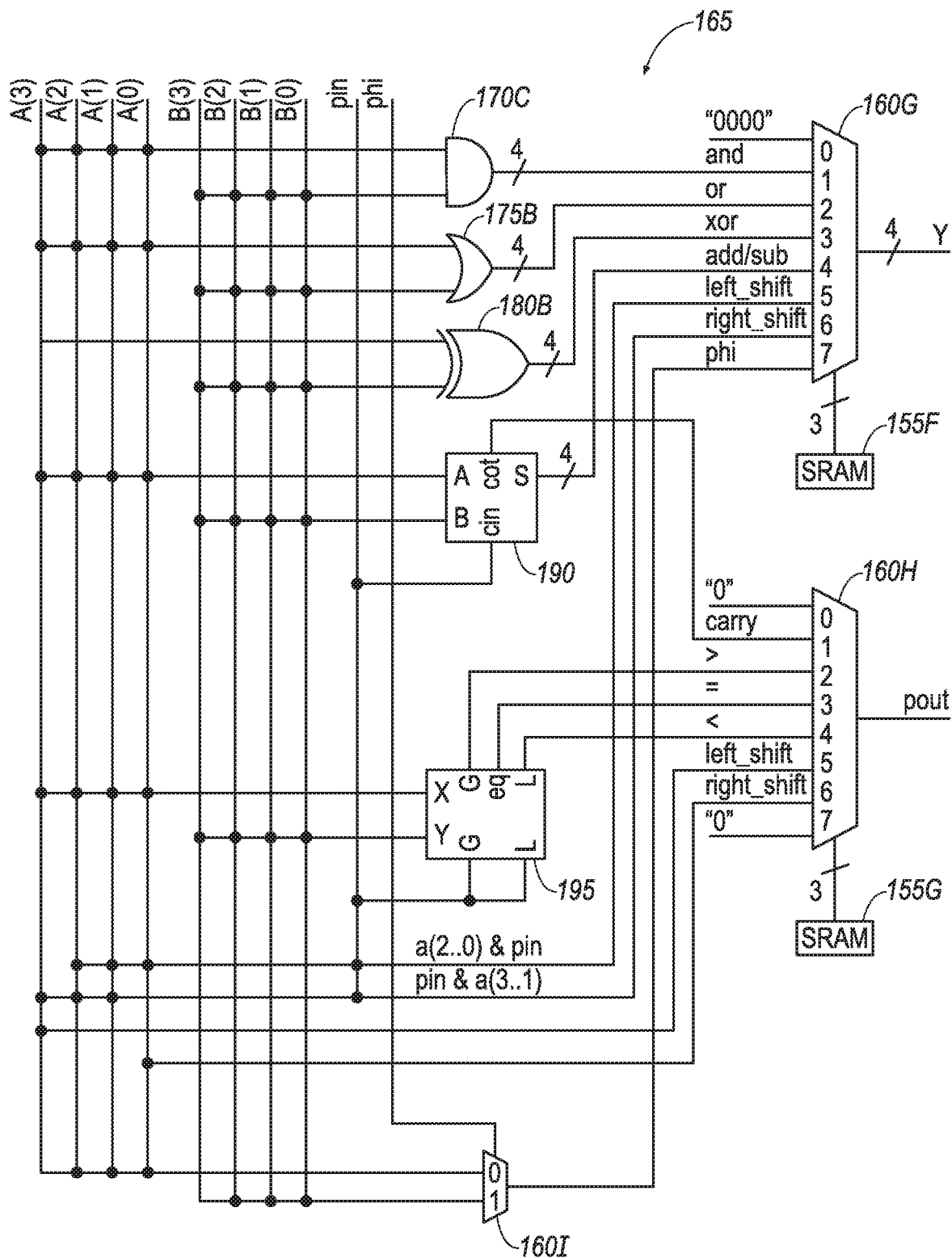
FIG. 4 illustrates example components of the arithmetic logic unit used in the operation block of the field programmable operation array.

FIG. 4 illustrates components of an example ALU 165 found in each of the operation blocks 145. As shown, each ALU 165 includes logic gates separate from those discussed above, an adder block 190, a comparison block 195, and memory 155 (including a memory 155F and a memory 155G) and multiplexers 160 (including a multiplexer 160G, a multiplexer 160H, and a multiplexer 160I) separate from those discussed above.

The logic gates included in the ALU 165 include an AND gate 170C, an OR gate 175B, and an XOR gate 180B. The AND gate 170C performs a bitwise AND operation on the two multi-bit inputs provided to the ALU 165. The output of the AND gate 170C represents the result of the bitwise AND operation and is provided to the multiplexer 160G. The OR gate 175B performs a bitwise OR operation on the two multi-bit inputs provided to the ALU 165. The output of the OR gate 175B represents the result of the bitwise OR operation and is provided to the multiplexer 160G. The XOR gate 180B performs a bitwise XOR operation on the two multi-bit inputs provided to the ALU 165. The output of the XOR gate 180B represents the result of the bitwise XOR operation and is provided to the multiplexer 160G.

The adder block 190 is implemented via electronic components that receive the two multi-bit inputs to the ALU 165 and outputs the sum of those inputs. The result of the adder block 190, representing the sum of the two multi-bit inputs, is output to the multiplexer 160G. The adder block 190 further outputs a carry out bit ($c_{out}$), based on the sum of the two multi-bit inputs, to the multiplexer 160H. The adder block 190 further receives the pass signal provided to the ALU 165 as a carry in bit ($c_{in}$). The sum of the two multi-bit inputs output to the multiplexer 160G, the carry out bit ($c_{out}$) provided to the multiplexer 160H, or both, may be further based on the value of the carry in bit ($c_{in}$). Although discussed as an adder block 190, in some instances, the adder block 190 may further or alternatively operate as a subtractor block that outputs the difference between the two multi-bit inputs provided to the ALU 165 to the multiplexer 160G. Whether the adder block 190 operates as an adder block 190 or a subtractor block may be based on a control signal (e.g., the opcode) provided to the adder block 190. That is, upon receipt of the control signal, the adder block 190 may add one of the multi-bit inputs to the two's complement of the other of the multi-bit inputs, the output of which is the difference between the two multi-bit inputs to the ALU 165.

The comparison block 195 is implemented via electronic components that compare the two multi-bit inputs to the ALU 165 to one another, and output a signal indicating whether one of the two multi-bit inputs to the ALU 165 is greater than, less than, or equal to the other multi-bit input to the ALU 165. The outputs of the comparison block 195 are provided to the multiplexer 160H. Besides the multi-bit inputs to the ALU 165, the comparison block 195 further receives the pass signal to enable the greater than and less than functions of the comparison block 195.

The memory 155 includes the memory 155F and the memory 155G outputting data to the multiplexer 160G and the multiplexer 160H, respectively. The memory 155F and memory 155G are each implemented via circuits, chips or other electronic components and can include, e.g., static random-access memory (SRAM). The data output by the memory 155F can be used to control the output of the multiplexer 160G. The data output by the memory 155G can be used to control the output of the multiplexer 160H. Further, although shown as separate, the memory 155D and memory 155F may be part of the same memory cell.

The multiplexers 160, implemented via electronic components, include the multiplexer 160G, the multiplexer 160H, and the multiplexer 160I. The multiplexer 160G receives, as a multi-bit input, the outputs of the AND gate 170C, the OR gate 175B, the XOR gate 180B, and the adder block 190. The multiplexer 160G may further receive as inputs a multi-bit logic zero ("0000" shown in FIG. 4). Another input to the multiplexer 160G may represent a left shift of one of the multi-bit inputs. That is, the multiplexer 160G may receive the three least significant bits of one of the multi-bit inputs along with the pass signal to indicate a left shift. Another input to the multiplexer 160G may represent a right shift of one of the multi-bit inputs. That is, the multiplexer 160G may receive the three most significant bits of one of the multi-bit inputs along with the pass signal to indicate a right shift. Finally, as shown in FIG. 4, the multiplexer 160G may receive the output of the multiplexer 160I, discussed below. The output of the multiplexer 160G may be the output of the ALU 165 provided to, e.g., the flip-flop 150C discussed above. Further, as discussed above, the output of the multiplexer 160G may be based on the output of the memory 155F.

The multiplexer 160H may receive the following as inputs: a logic zero ("0"), the carry out bit ($c_{out}$) of the adder block 190, and the greater than, less than, and equal to outputs of the comparison block 195. Further, the multiplexer 160H may receive the most significant bit from one of the multi-bit inputs to the ALU 165 for a left shift operation and the least significant bit from one of the multi-bit inputs to the ALU 165 for a right shift operation. The output of the multiplexer 160H may represent the pass signal output by the ALU 165 to one of the connection blocks 135, as discussed above, so that the output pass signal of the ALU 165 can serve as the input pass signal to, e.g., another ALU 165 in another operation block 145.

The multiplexer 160I may receive the three least significant bits of one of the multi-bit inputs to the ALU 165 and the three least significant bits of the other of the multi-bit inputs to the ALU 165. The output of the multiplexer 160I may be based on the control signal (opcode) provided to the ALU 165. The output of the multiplexer 160I may be provided to the multiplexer 160G.

Each operation block 145 may be programmed through a single configuration byte. The five most significant bits (e.g., bits 7-3) may represent the ALU 165 operation including addition or subtraction, bitwise operations (AND, OR, or XOR), comparison operations, shift operations (left shift, right shift, unsigned right shift, etc.), or the like. The next two most significant bits (e.g., bits 2-1) may represent the enable signals discussed above. The final bit (e.g., bit 0) may be used to invert the result of the comparison operations. The configuration byte may be stored in the memory 155 (i.e., one or more memory cells) of the operation block 145.

Figure 5:
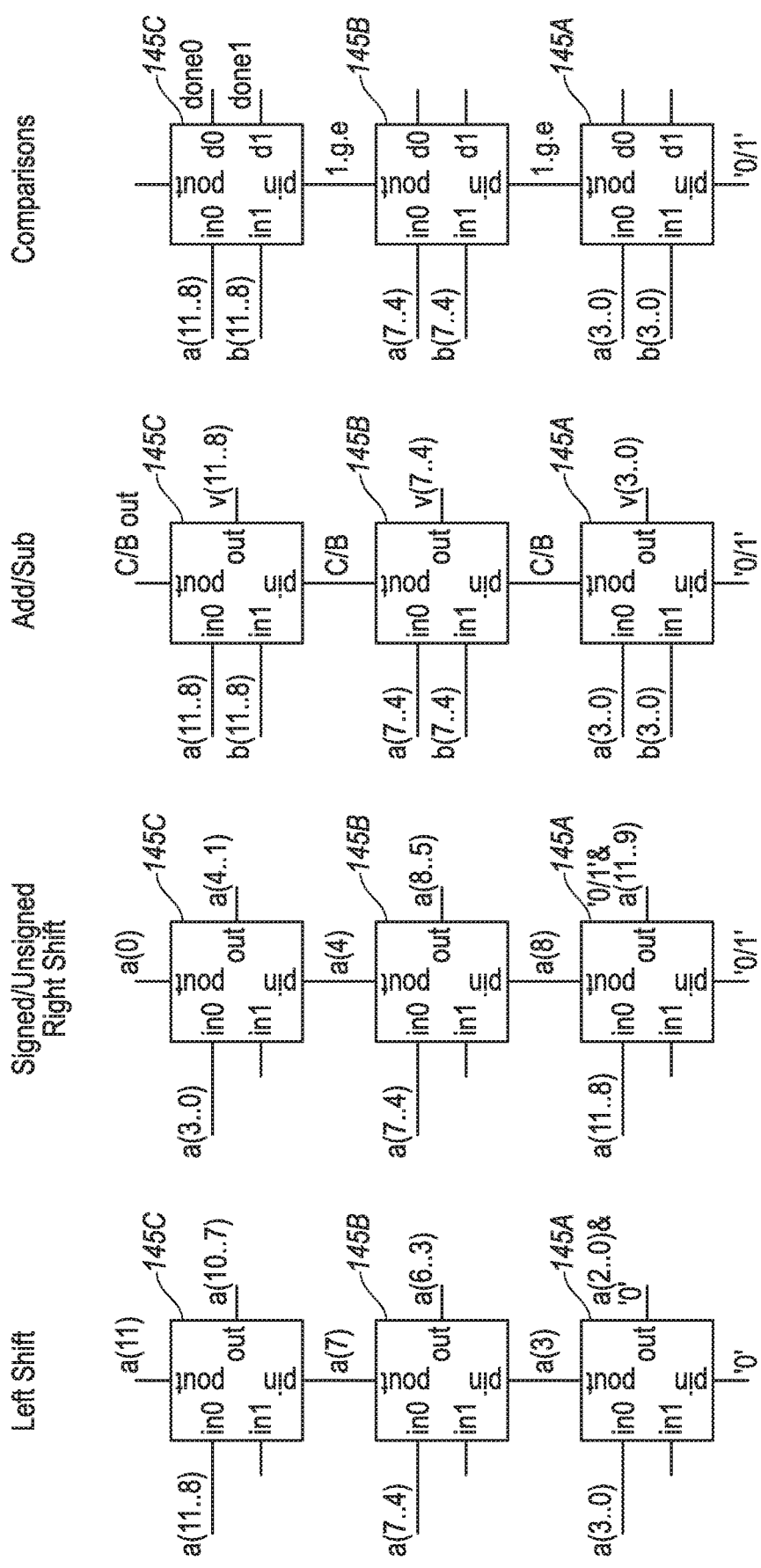
FIGS. 5A-5D illustrate examples of chaining multiple operation blocks together for various operations.

Referring now to FIGS. 5A-5D, operation blocks 145 may be chained together to implement operations of arbitrary bit-widths. For example, the pass signals may be used to link operation blocks 145 together in a way that allows the operation blocks 145 to output more than four bits of data for various operations. For example, as shown in FIG. 5A, three operation blocks 145 are linked via their pass signals to output a 12-bit result of left-shifting the collective 12-bit input to the three operation blocks 145. The operation block 145A receives the four least significant bits (bits 3 through 0) of the 12-bit input, as well as a logic "0" through its input pass signal, and outputs a logic "0" along with the three least significant bits (bits 2 through 0) as its multi-bit output. The fourth least significant bit (bit 3) is output, via the output pass signal of the operation block 145A, to the operation block 145B. The operation block 145B also receives, via a connection block 135, a multi-bit input that includes bits 7 through 4 of the collective 12-bit input. For the left-shift operation, the operation block 145B outputs bits 3-6 as its multi-bit output and outputs, via the output pass signal, bit 7 to the operation block 145C. The operation block 145C receives bit 7 as its input pass signal as well as a multi-bit input that includes bits 8-11 of the 12-bit input. The operation block 145C outputs bits 7-10 as its multi-bit output and outputs bit 11 via its output pass signal. Thus, the operation blocks 145 shown in FIG. 5A can be linked together via their pass signals to implement a left-shift operation of a collective 12-bit input.

FIG. 5B illustrates an example right-shift operation performed by the operation block 145A, the operation block 145B, and the operation block 145C. The operation block 145A receives bits 8-11 of the 12-bit input. The operation block 145A further receives a logic "0" or "1" via an input pass signal. The multi-bit output of the operation block 145A is the logic "0" or "1" received via the input pass signal along with bits 9-11. The operation block 145A further outputs bit 8 to the operation block 145B via the output pass signal. The operation block 145B receives bit 8 output via the output pass signal of the operation block 145A, as well as bits 4-7 via its multi-bit input. The multi-bit output of the operation block 145B includes bits 5-8. The operation block 145B further outputs bit 4 via its output pass signal. The operation block 145C receives bit 4 output from the operation block 145B as well as its multi-bit input, which includes bits 0-3. The multi-bit output of the operation block 145C includes bits 1-4. The operation block 145C outputs bit 0 through its output pass signal. As such, the operation block 145A, the operation block 145B, and the operation block 145C can be combined to perform a right-shift (signed or unsigned) operation on a collective 12-bit input.

FIG. 5C illustrates how the operation block 145A, the operation block 145B, and the operation block 145C can be combined to add or subtract two collective 12-bit inputs. The operation block 145A receives bits 0-3 of input A and bits 0-3 of input B. It also receives, via its input pass signal, either a logic "0" or "1". The multi-bit output of the operation block 145A is the sum or difference (depending on whether the operation blocks 145 are performing addition or subtraction) of bits 0-3 of inputs A and B. The operation block 145A further outputs a carry bit via its output pass signal. The operation block 145B receives bits 4-7 of input A and bits 4-7 of input B. It also receives, via its input pass signal, either the carry bit output by the operation block 145A. The multi-bit output of the operation block 145B is the sum or difference (depending on whether the operation blocks 145 are performing addition or subtraction) of bits 4-7 of inputs A and B, while accounting for the carry bit output by the operation block 145A. The operation block 145B further outputs a carry bit via its output pass signal. The operation block 145C receives bits 8-11 of input A and bits 8-11 of input B. It also receives, via its input pass signal, either the carry bit output by the operation block 145B. The multi-bit output of the operation block 145C is the sum or difference (depending on whether the operation blocks 145 are performing addition or subtraction) of bits 8-11 of inputs A and B, while accounting for the carry bit output by the operation block 145B. The operation block 145C further outputs a carry bit via its output pass signal. The result of the operation block 145A, the operation block 145B, and the operation block 145C is a collective 12-bit value representing the sum or difference of the 12 bits of inputs A and B.

FIG. 5D illustrates how the operation block 145A, the operation block 145B, and the operation block 145C can be combined to compare two collective 12-bit inputs. The operation block 145A receives bits 0-3 of input A and bits 0-3 of input B. It also receives, via its input pass signal, either a logic "0" or "1". The operation block 145A compares bits 0-3 of input A to bits 0-3 of input B. The operation block 145A outputs a pass signal indicating whether bits 0-3 of input A are greater than, less than, or equal to bits 0-3 of input B. The pass signal output by the operation block 145A is the input pass signal of the operation block 145B. The operation block 145B receives bits 4-7 of input A and bits 4-7 of input B. It also receives, via its input pass signal, the output pass signal of the operation block 145A, which represents whether the least significant bits (bits 0-3) of input A are greater than, less than, or equal to the least significant bits (bits 0-3) of input B. The operation block 145B compares bits 4-7 of input A to bits 4-7 of input B. Because the operation block 145B receives the pass signal output by the operation block 145A, the operation block 145B can determine whether bits 0-7 of input A are greater than, less than, or equal to bits 0-7 of input B. As such, the operation block 145B outputs a pass signal indicating whether bits 0-7 of input A are greater than, less than, or equal to bits 0-7 of input B. The pass signal output by the operation block 145B is the input pass signal of the operation block 145C. The operation block 145C receives bits 8-11 of input A and bits 8-11 of input B. It also receives, via its input pass signal, the output pass signal of the operation block 145B, which represents whether bits 0-7 of input A are greater than, less than, or equal to bits 0-7 of input B. The operation block 145C compares bits 8-11 of input A to bits 8-11 of input B. Because the operation block 145B receives the pass signal output by the operation block 145B, the operation block 145C can determine whether bits 0-11 of input A are greater than, less than, or equal to bits 0-11 of input B. As such, the operation block 145C may output a pass signal indicating whether bits 0-11 of input A are greater than, less than, or equal to bits 8-11 of input B. The operation block 145C outputting the pass signal may trigger the flip-flop 150A to output a done signal ("done1" in FIG. 3) or trigger the flip-flop 150B to output a done signal ("done0" in FIG. 3) depending on whether input A is greater than, less than, or equal to input B.

Figure 6:
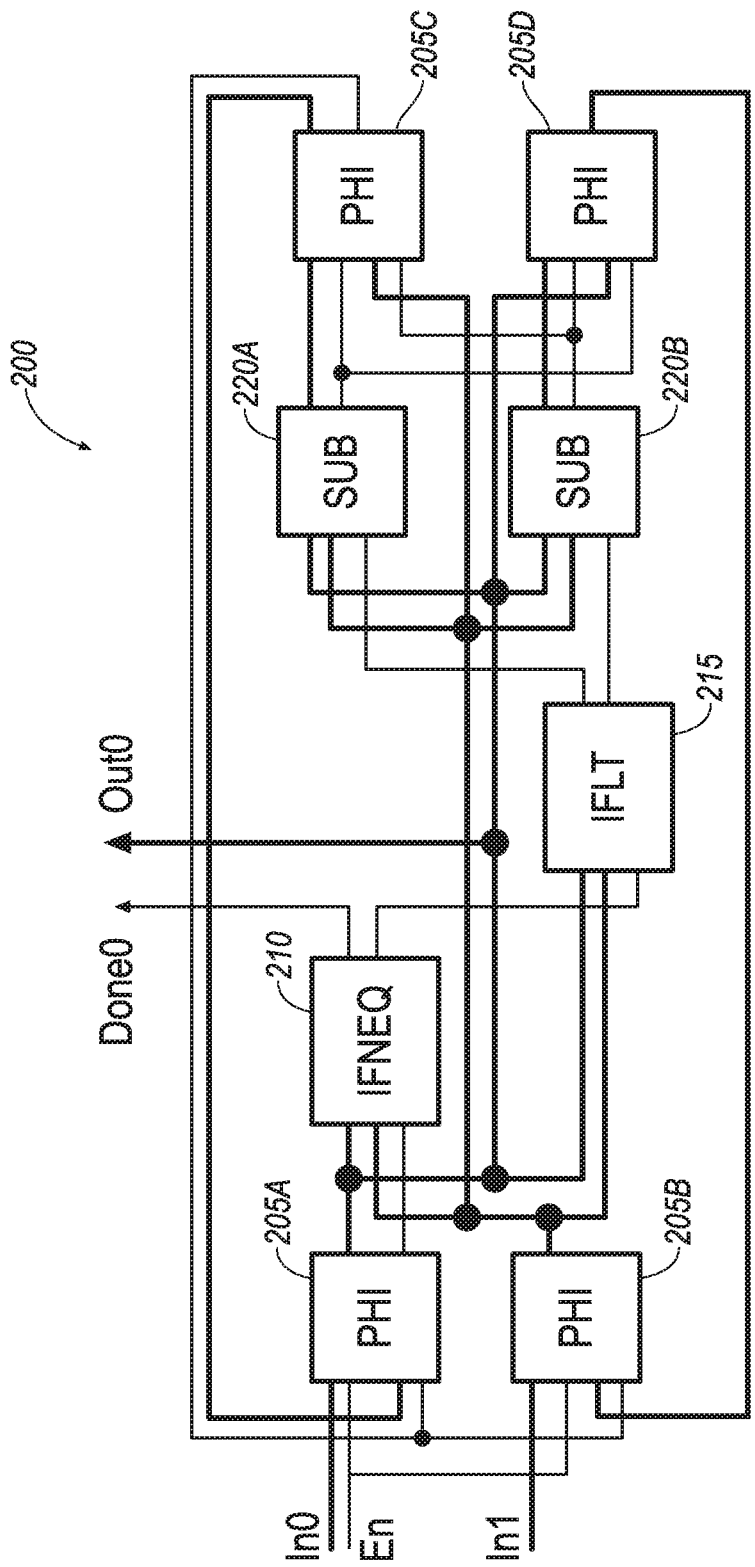
FIG. 6 illustrates an example data flow circuit generated by an HLS tool to implement a greatest common divisor operation.

FIG. 6 is a block diagram illustrating an example output of the HLS tool 115 implementing a greatest common divisor operation. A high-level description of the greatest common divisor operation may be defined via computer code, such as C++, Java, etc., provided to the programming tool 110 of FIG. 1. The programming tool 110 provides the code to the HLS tool 115, which converts the high-level description into an intermediate representation. A control-dataflow graph may be generated from the intermediate representation, and the control-dataflow graph may be used to generate a stateless, self-propagating data flow circuit. FIG. 6 represents an example data flow circuit for the greatest common divisor operation.

One way to calculate the greatest common divisor of two integers, x and y, is to iteratively subtract the smaller of the two integers from the larger one. At each iteration, so long as the integers x and y are not equal, the larger integer (before subtracting the smaller integer) is redefined as the difference between the two integers. Put another way, if x is larger than y for a particular iteration, x is redefined as x-y for the next iteration. If y is larger than x, y is redefined as y-x for the next iteration. The iterations continue until x and y are equal to one another, at which point the result is the greatest common divisor of the integers x and y.

This operation can be carried out by the data flow circuit 200 of FIG. 6. The integers to be evaluated are represented by the inputs In0 and In1. Both inputs are provided to PHI blocks 205A and 205B (used for conditional routing), along with enable signals. Each PHI block 205 outputs to an IFNEQ block 210 that evaluates whether the two integers are not equal to one another. If they are not equal, the IFNEQ block 210 outputs the integers to the IFLT block 215, which determines which integer is less than the other integer (i.e., if In0 is less than In1, or vice versa). The IFLT block 215 outputs a signal to activate one of the subtraction (SUB) blocks 220A and 22B so that the smaller integer is subtracted from the larger integer. The IFNEQ block 210 further outputs the integers to both SUB blocks 220, but only the SUB block 220 activated by the IFLT block 215 will perform the subtraction operation on the integers. Each SUB block 220 outputs its result to PHI blocks 205C and 205D, where are fed back into the PHI blocks 205A and 205B, respectively, that originally received the integers as inputs. When the integers are equal, as determined by the IFNEQ block 210, the IFNEQ block 210 outputs the value of the integers as the output of the circuit. A done signal ("Done0") may also be output to indicate that the greatest common divisor operation is complete.

Using the data flow circuit 200, the FPOA tool 120 generates a netlist mapping a group of operation blocks 145 that can be used to carry out the foregoing operations. The netlist lists all of the operation blocks 145 needed to implement the data flow circuit 200 as well as the configuration of the FPOA 105 that will facilitate the data flow circuit 200. Further, the netlist defines the signals passed between the operation blocks 145 and IO blocks 130, including multi-bit data signals and the single-bit enable and pass signals.

The FPOA tool 120 may be further programmed to determine optimal physical placement of the operation blocks 145, IO blocks 130, switch blocks 140, connection blocks 135, etc., referenced in the netlist and used to implement the data flow circuit 200. The FPOA tool 120 may be programmed to select the components that, e.g., minimize routing wire length. In one possible approach, the FPOA tool 120 may optimize physical placement according to a simulated annealing-based placement operation. That is, after determining the optimal placements, the FPOA tool 120 is programmed to determine the configuration of the switch blocks 140 and connection blocks 135 to route each signal between each operation block 145 in the circuit. In one possible implementation, the entire routing network may be represented as a directed graph. Graph nodes may represent each pin on each operation block 145 and each available routing wire. Graph edges may represent all potential connections between the pins of the operation block 145 and the routing wires. The FPOA tool 120 is programmed to find a path in the directed graph for each pin-to-pin connection in the circuit. The FPOA tool 120 is programmed to make each path as short as possible while not overutilizing any resources. A negotiated congestion-delay operation may be used to perform the routing. The negotiated congestion-delay operation may include routing, rip-up, and rerouting strategies until every path in the circuit is routed without overlap.

Figure 7:
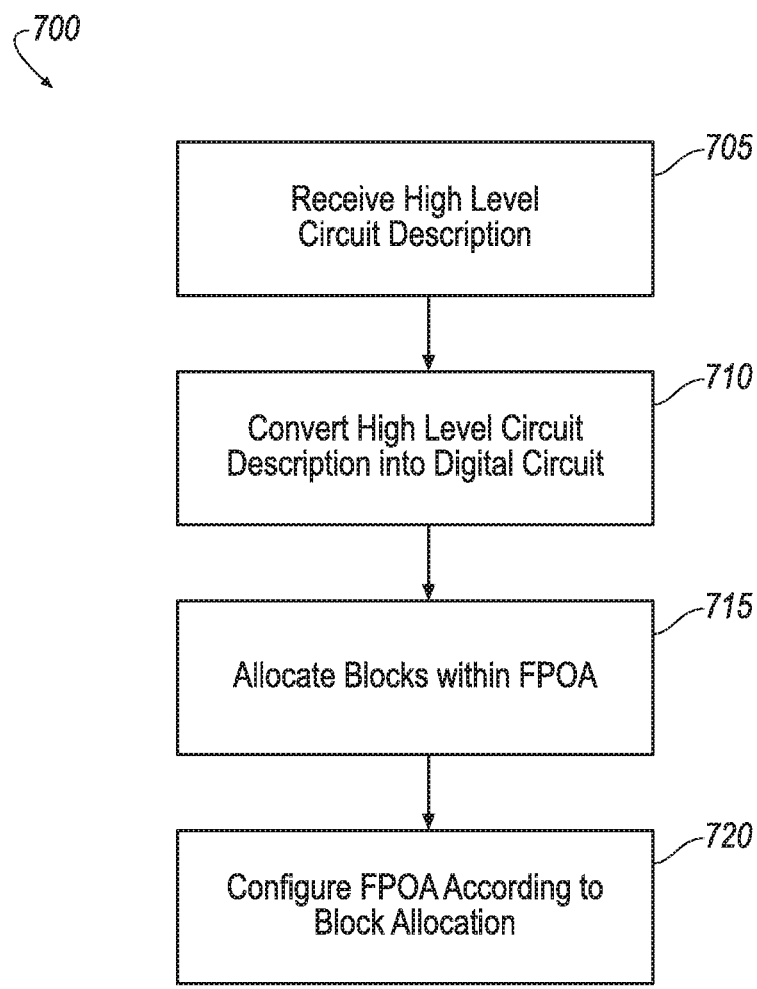
FIG. 7 is a flowchart of an example process that may be executed by the computer to program the field programmable operation array.

FIG. 7 is a flowchart of an example process 700 that may be executed by the computer 100 shown in FIG. 1. The process 700 may be executed by the computer 100 to program the FPOA 105 to carry out a particular circuit.

At block 705, the computer 100 receives a high-level description of the circuit to be implemented via the FPOA 105. That is, the computer 100 receives user inputs in the form of a programming language such as C, C++, Java, or the like. The user inputs may be received and processed by, e.g., the programming tool 110. The code may define a particular circuit to be implemented via the FPOA 105. The programming tool 110 may include a debugger programmed to, e.g., confirm that the circuit defined by the code meets certain functional specifications.

At block 710, the computer 100 converts the code into a digital circuit. That is, the HLS tool 115 running on the computer 100 receives the code output by the programming tool 110. The HLS tool 115 compiles the code input at block 705 and converts the output of the programming tool 110 into the digital circuit with a scheduled series of hardware operations. Further, the HLS tool 115 generates a netlist file containing a list of operations and their associated interconnections. The netlist file is generated according to the code output by the programming tool 110.

At block 715, the computer 100 allocates blocks within the FPOA 105 to carry out the digital circuit developed at block 710. That is, the FPOA tool 120 run by the computer 100 receives the netlist file output by the HLS tool 115, determines the placement of the operation blocks 145, and generates a programming file specifying the operation blocks 145 and interconnects that will carry out the circuit represented by the code entered by the user via the programming tool 110.

At block 720, the computer 100 configures the FPOA 105. That is, the FPOA tool 120 may output configuration bytes, discussed above, to memory 155 embedded in the various components of the FPOA 105, including memory 155 incorporated into the IO blocks 130, connection blocks 135, switch blocks 140, and operation blocks 145 used to carry out the circuit. As a result, the IO blocks 130, connection blocks 135, switch blocks 140, and operation blocks 145 may be appropriately chained together to carry out the digital circuit.

In general, the computing systems and/or devices described may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OSX and iOS operating systems distributed by Apple Inc. of Cupertino, Calif., the BlackBerry OS distributed by Blackberry, Ltd. of Waterloo, Canada, and the Android operating system developed by Google, Inc. and the Open Handset Alliance. Examples of computing devices include, without limitation, a computer workstation, a server, a desktop, notebook, laptop, or handheld computer, or some other computing system and/or device.

Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A field programmable operation array comprising:
an interconnect network; and
a plurality of operation blocks, including a first operation block and a second operation block, electrically connected to the interconnect network,
wherein each operation block includes an arithmetic logic unit and a plurality of logic gates, and
wherein a pass signal output by the arithmetic logic unit of the first operation block is received by the arithmetic logic unit of the second operation block,
wherein each arithmetic logic unit is configured to receive two multi-bit inputs via the interconnect network, and wherein the pass signal is received by the arithmetic logic unit of the second operation block independent of the interconnect network,
wherein each arithmetic logic unit includes an AND gate, an OR gate, and an XOR gate configured to receive the two multi-bit inputs and output a multi-bit signal,
wherein each arithmetic logic unit includes an adder block configured to receive the two multi-bit inputs and output a multi-bit signal representing a sum of or difference between the two multi-bit inputs, and
wherein each arithmetic logic unit includes a comparison block configured to receive the two multi-bit inputs and output a comparison signal indicating that a first of the two multi-bit inputs is greater than, less than, or equal to a second of the two multi-bit inputs.

2. The field programmable operation array of claim 1, wherein each arithmetic logic unit includes a first multiplexer electrically connected to the AND gate, the OR gate, the XOR gate, and the adder block.

3. The field programmable operation array of claim 2, wherein each arithmetic logic unit includes a second multiplexer electrically connected to the comparison block.

4. The field programmable operation array of claim 3, wherein the second multiplexer is configured to output the pass signal.

5. An operation block for a field programmable operation array, the operation block comprising:
an arithmetic logic unit configured to output a pass signal to another operation block in the field programmable operation array; and
a plurality of logic gates including a first AND gate, a second AND gate, a first XOR gate, and a first OR gate,
wherein the arithmetic logic unit is configured to receive two multi-bit inputs via an interconnect network, and wherein the pass signal is output to another operation block independent of the interconnect network,
wherein the arithmetic logic unit includes a third AND gate, a second OR gate, and a second XOR gate configured to receive the two multi-bit inputs and output a multi-bit signal,
wherein the arithmetic logic unit includes an adder block configured to receive the two multi-bit inputs and output a multi-bit signal representing a sum of or difference between the two multi-bit inputs, and
wherein the arithmetic logic unit includes a comparison block configured to receive the two multi-bit inputs and output a comparison signal indicating that a first of the two multi-bit inputs is greater than, less than, or equal to a second of the two multi-bit inputs.

6. The operation block of claim 5, wherein the arithmetic logic unit includes a first multiplexer electrically connected to the third AND gate, the second OR gate, the second XOR gate, and the adder block.

7. The operation block of claim 6, wherein the arithmetic logic unit includes a second multiplexer electrically connected to the comparison block, wherein the second multiplexer is configured to output the pass signal.

8. The operation block of claim 5, further comprising a plurality of flip-flops including a first flip-flop, a second flip-flop, and a third flip-flop.

9. The operation block of claim 8, wherein the first flip-flop is electrically connected to an output of the second AND gate, the second flip-flop is electrically connected to an output of the first AND gate and the OR gate, and the third flip-flop is electrically connected to an output of the arithmetic logic unit.

* * * * *